(12) United States Patent  
Wang

(10) Patent No.: US 9,793,466 B2  
(45) Date of Patent: Oct. 17, 2017

(54) ULTRASONIC SENSOR AND MANUFACTURING METHOD THEREOF

(71) Applicant: MiiCs & Partners Inc., Road Town (VG)

(72) Inventor: Juan Wang, Shenzhen (CN)

(73) Assignee: MiiCs & Partners Inc., Road Town (VG)

( * ) Notice: Subject to any disclaimer, the term of this patent is extended or adjusted under 35 U.S.C. 154(b) by 510 days.

(21) Appl. No.: 14/555,722

(22) Filed: Nov. 28, 2014

(65) Prior Publication Data

US 2016/0149117 A1 May 26, 2016

(30) Foreign Application Priority Data

Nov. 24, 2014 (CN) .......................... 2014 1 0678969

(51) Int. Cl.
| | |
|---|---|
| *H01L 41/107* | (2006.01) |
| *H01L 41/047* | (2006.01) |
| *H01L 41/113* | (2006.01) |
| *H01L 41/29* | (2013.01) |

(52) U.S. Cl.  
CPC ...... *H01L 41/1132* (2013.01); *H01L 41/0478* (2013.01); *H01L 41/29* (2013.01)

(58) Field of Classification Search  
CPC ... H01L 41/1132; H01L 41/0478; H01L 41/29  
USPC .......................... 310/322, 334, 338, 367, 368  
See application file for complete search history.

(56) References Cited

U.S. PATENT DOCUMENTS

| | | | |
|---|---|---|---|
| 4,656,384 A | 4/1987 | Magori | |
| 2011/0090049 A1* | 4/2011 | Setlak | G06K 9/0002 340/5.83 |
| 2013/0133428 A1* | 5/2013 | Lee | G06K 9/0012 73/589 |
| 2014/0198072 A1 | 7/2014 | Schuele | |
| 2016/0299625 A1* | 10/2016 | Kano | G06F 3/0414 |

FOREIGN PATENT DOCUMENTS

JP 2000-165993 A * 11/1998 ............. H04R 17/00

* cited by examiner

*Primary Examiner* — Thomas Dougherty  
(74) *Attorney, Agent, or Firm* — Steven Reiss

(57) ABSTRACT

An ultrasonic sensor includes a substrate. A first electrode and a first piezoelectric layer are stacked on one side of the substrate. A second electrode and a second piezoelectric layer are stacked on the other side of the substrate. A notch is defined in the first piezoelectric layer. And a conductive film is coated within the notch to couple the first electrode and the first piezoelectric layer.

19 Claims, 8 Drawing Sheets

ULTRASONIC SENSOR AND MANUFACTURING METHOD THEREOF

CROSS-REFERENCE TO RELATED APPLICATIONS

This application claims priority to Chinese Patent Application No. 201410678969.4 filed on Nov. 24, 2014 in the China Intellectual Property Office, the contents of which are incorporated by reference herein.

FIELD

The disclosure generally relates to an ultrasonic sensor and a manufacturing method of the ultrasonic sensor.

BACKGROUND

An ultrasonic sensor includes a reception electrode to receive a voltage generated by a piezoelectric layer and the voltage is generated by the piezoelectric layer according to an ultrasonic wave. Generally, the reception electrode is electrically coupled to the piezoelectric layer via a conductive film in an edge area of the ultrasonic sensor. However, due to a high surface tension of the piezoelectric layer, the conductive film usually misses a part in an edge of the conductive film.

BRIEF DESCRIPTION OF THE DRAWINGS

Implementations of the present technology will now be described, by way of example only, with reference to the attached figures, wherein.

DETAILED DESCRIPTION

Figure 1:
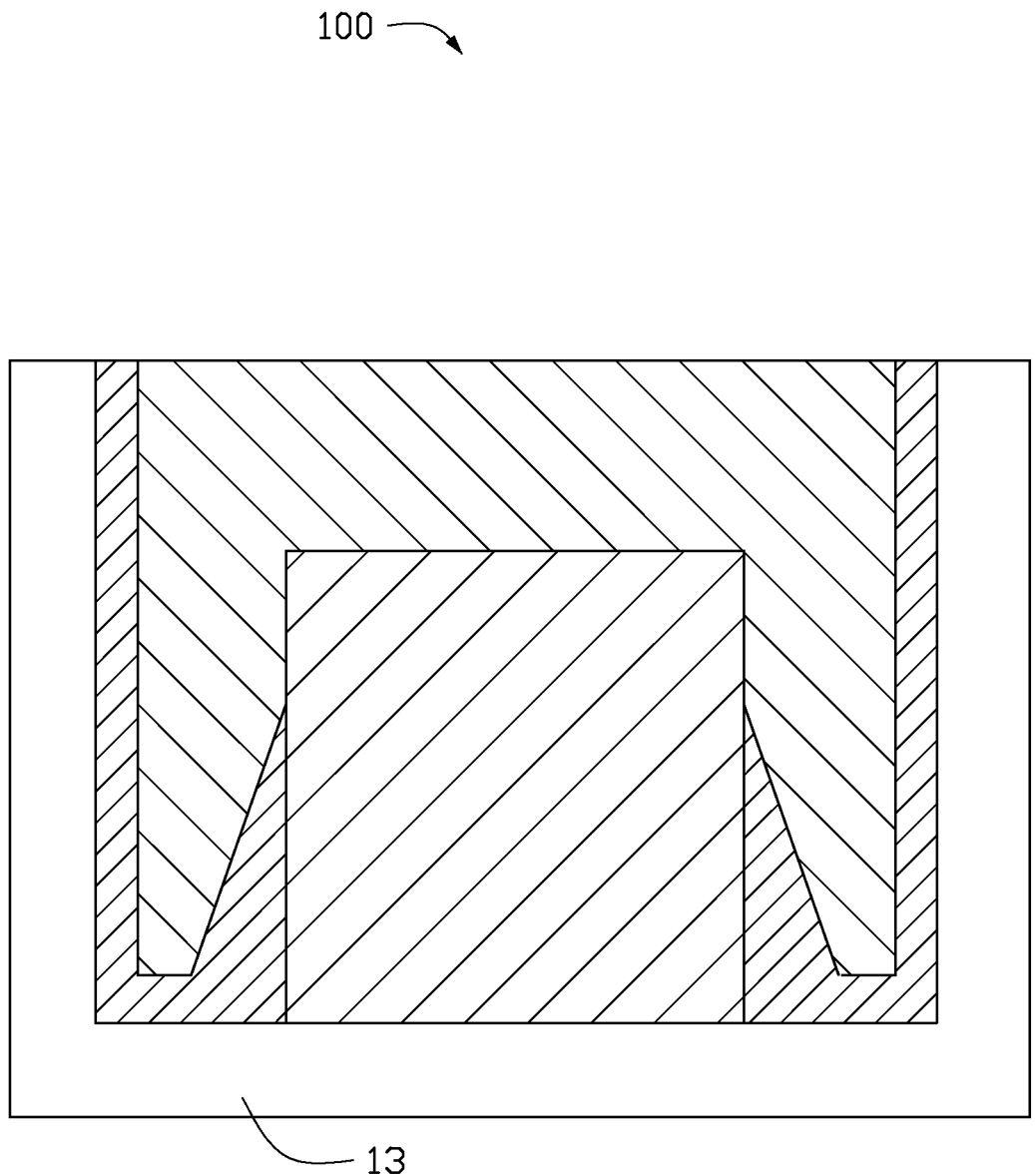
FIG. 1 is a cross-sectional plan view of an ultrasonic sensor according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 2:
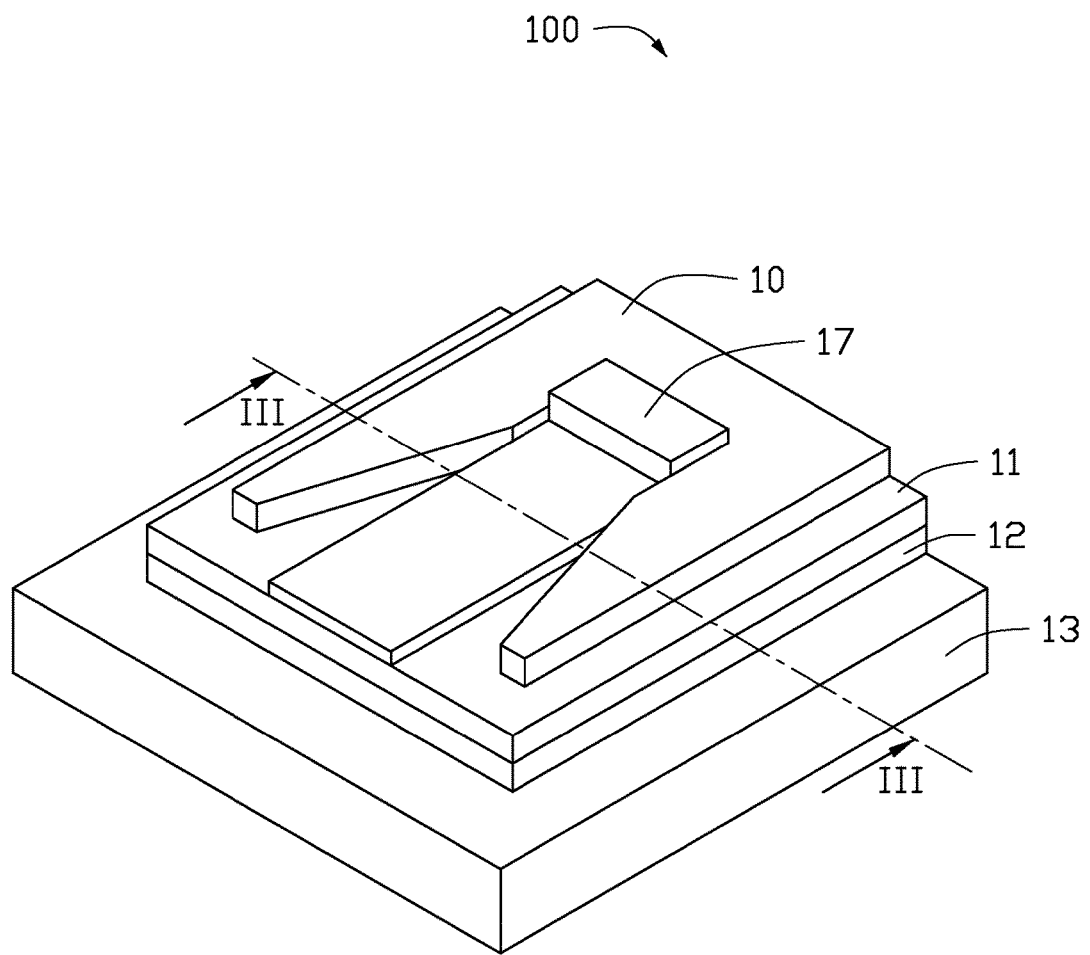
FIG. 2 is isometric side view of the ultrasonic sensor of FIG. 1.
Figure 3:
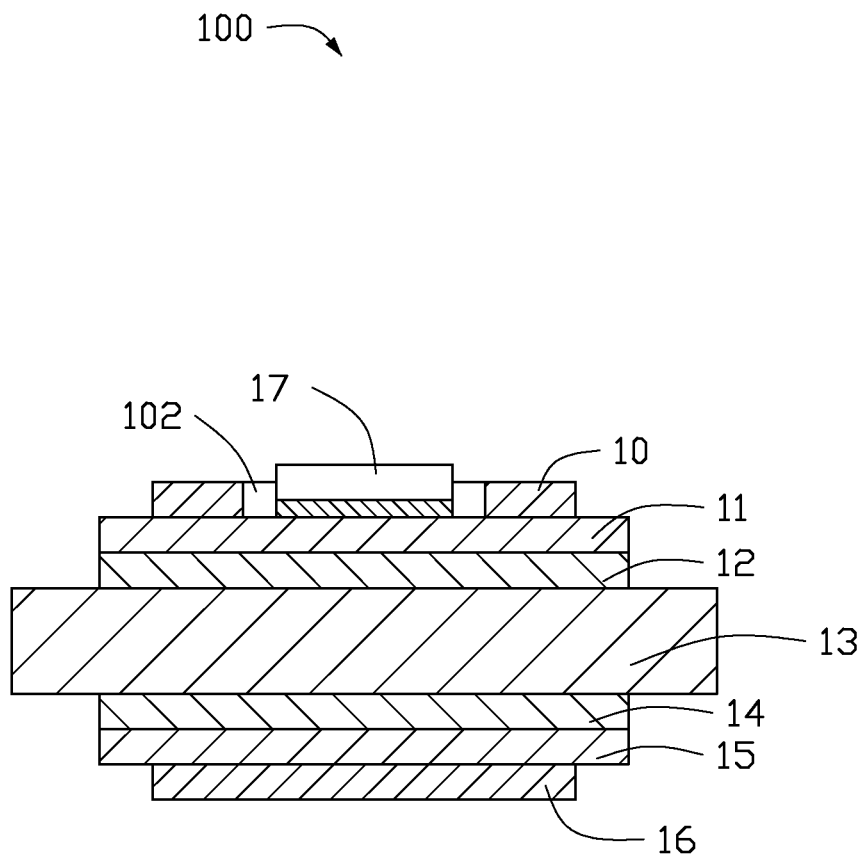
FIG. 3 is sectional view of the ultrasonic sensor along line III-III of FIG. 2.

Referring to FIGS. 1-3, an ultrasonic sensor 100 can include a first piezoelectric layer 10, a first electrode 11, a first adhesive layer 12, a substrate 13, a second adhesive layer 14, a second electrode 15, and a second piezoelectric layer 16 successively stacked. The ultrasonic sensor 100 can further include a conductive film 17 coupled between the first electrode 11 and the first piezoelectric layer 10.

The substrate 13 can be a transparent substrate, such as a glass substrate, a silicon substrate, a sapphire substrate or a flexible transparent substrate. In the embodiment, the substrate 13 can be a glass substrate.

The first electrode 11 is coupled to one side of the substrate 13 via the first adhesive layer 12. The second electrode 15 is coupled to the other side of the substrate 13 via the second adhesive layer 14 opposite to the first electrode 11. In the embodiment, the first adhesive layer 12 and the second adhesive layer 14 can be a light curable adhesive. In other embodiment, the first electrode 11 and the second electrode 15 can be directly formed on the substrate 13. The first electrode 11 can be made of monolayer transparent conducting materials or multilayer transparent conducting materials. The monolayer transparent conducting material includes ITO (Indium Tin Oxide), ZnO (Zinc Oxide), PEDOT (Poly-ethylenedioxythiophene), CNT (Carbon Nanotube), AgNW (Argentum Nano Wire), or graphene.

The first piezoelectric layer 10 is coated on the first electrode 11. In the embodiment, the first piezoelectric layer 10 can be polyvinylidene fluoride (PVDF). The first piezoelectric layer 10 can be a monolayer structure or a multilayer structure. In other embodiment, the first piezoelectric layer 10 can include aluminum nitride (AlNx), Silicon oxide (SiOx), lead zirconium titanate (PZT), $LiTaO_3$, or zinc oxide (ZnOx). A notch 102 is defined in an edge area of the first piezoelectric layer 10. A cross section of the notch 102 can be a trapezoid. In the embodiment, a thickness of the first piezoelectric layer 10 is larger than 5 micrometers.

The conductive film 17 is arranged within the notch 102. The first electrode 11 is electrically coupled to the first piezoelectric layer 10 via the conductive film 17. In the embodiment, the conductive film 17 is made of conductive silver paste and a diameter of silver particle in the conductive silver paste is larger than 0.01 micrometers and less than 10 micrometers. In the embodiment, a thickness of the conductive film 17 is less than 10 micrometers and a cohesion force of the conductive film 17 is larger than a surface tension force of the first piezoelectric layer 10.

The second piezoelectric layer 16 is coated on the second electrode 15. In the embodiment, the second piezoelectric layer 16 can be polyvinylidene fluoride (PVDF). The second piezoelectric layer 16 can be a monolayer structure or a multilayer structure. In other embodiment, the second piezoelectric layer 16 can include aluminum nitride (AlNx), Silicon oxide (SiOx), lead zirconium titanate (PZT), LiTaO$_3$, or zinc oxide (ZnOx).

In the embodiment, the second electrode 15 can be a transmission electrode to output a first voltage to the second piezoelectric layer 16 and the first electrode 11 can be a reception electrode to receive a second voltage generated by the first piezoelectric layer 10. In operation, the second electrode 15 outputs the first voltage to the second piezoelectric layer 16; the second piezoelectric layer 16 vibrates to generate an ultrasonic wave under the first voltage. When a finger or a touch pen touches the ultrasonic sensor 100, the ultrasonic wave is reflected to the first piezoelectric layer 10 by the finger or the touch pen. The first piezoelectric layer 10 converts the ultrasonic wave to a second voltage and outputs the second voltage to the first electrode 11 via the conductive film 17.

In other embodiment, the ultrasonic sensor 100 can further include an insulating layer covered the first piezoelectric layer 10 to protect the first piezoelectric layer 10. The insulating layer can be boron nitride or diamond.

FIGS. 4-7 show sectional views illustrating a manufacturing method of the ultrasonic sensor 100. FIG. 8 is a flowchart of the manufacturing method of the ultrasonic sensor. The method begins at block 201.

Figure 4:
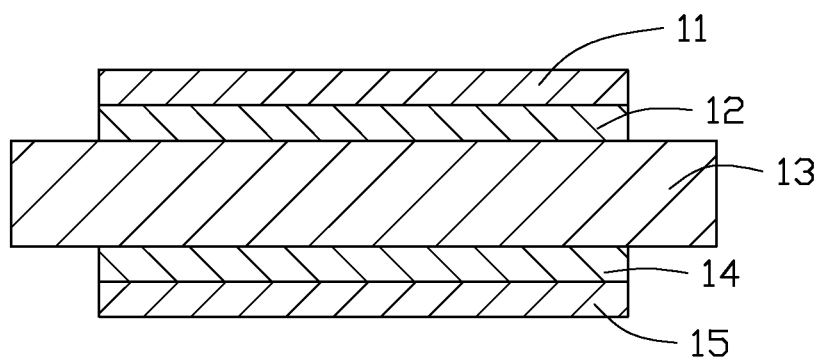
FIGS. 4-7 are sectional views illustrating a manufacturing method of the ultrasonic sensor of FIG. 1.

At block 201, as shown in FIG. 4, the first electrode 11 and the second electrode 15 are coupled to two opposite sides of the substrate 13. The first electrode 11 is coupled to one side of the substrate 13 via the first adhesive layer 12 and the second electrode 15 is coupled to the other side of the substrate 13 opposite to the first electrode 11 via the second adhesive layer 14. The substrate 13 can be a transparent substrate, such as a glass substrate, a silicon substrate, a sapphire substrate or a flexible transparent substrate. In the embodiment, the substrate 13 can be a glass substrate. The first electrode 11 and the second electrode 15 can be made of monolayer transparent conducting materials or multilayer transparent conducting materials. The monolayer transparent conducting material includes ITO (Indium Tin Oxide), ZnO (Zinc Oxide), PEDOT (Poly-ethylenedioxythiophene), CNT (Carbon Nanotube), AgNW (Argentum Nano Wire), or graphene. The multilayer transparent conducting material includes a multilayer structure with successively stacked ITO, Argentums, and ITO. In the embodiment, a transparent conductive material is deposited on the substrate 13 by sputtering, vacuum evaporation, pulsed laser deposition (PLD), or Plasma Enhanced CVD (PECVD) and the transparent conductive material is patterned to form the first electrode 11 and the second electrode 15.

Figure 5:
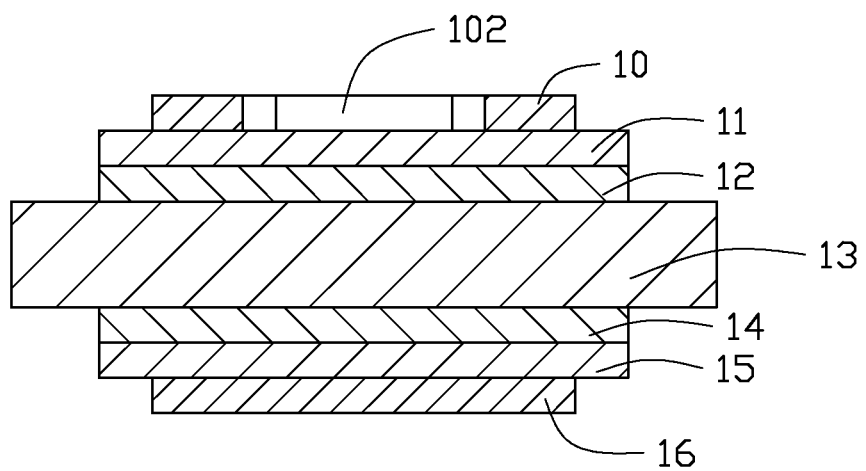

At block 203, as shown in FIG. 5, the first piezoelectric layer 10 is coated on the first electrode 11 and the second piezoelectric layer 16 is coated on the second electrode 15. In the embodiment, the first piezoelectric layer 10 and second piezoelectric layer 16 can be polyvinylidene fluoride (PVDF). In other embodiment, the first piezoelectric layer 10 and the second piezoelectric layer 16 can include aluminum nitride (AlNx), Silicon oxide (SiOx), lead zirconium titanate (PZT), LiTaO$_3$, or zinc oxide (ZnOx). In the embodiment, a thickness of the first piezoelectric layer 10 is larger than 5 micrometers (um). In detail, a piezoelectric material is coated on the first electrode 11 and the second electrode 15 by sputtering, vacuum evaporation, pulsed laser deposition (PLD), or Plasma Enhanced CVD (PECVD) and the piezoelectric material are patterned to form the first piezoelectric layer 10 corresponding to the first electrode 11 and the second piezoelectric layer 16 corresponding to the second electrode 15.

Figure 6:
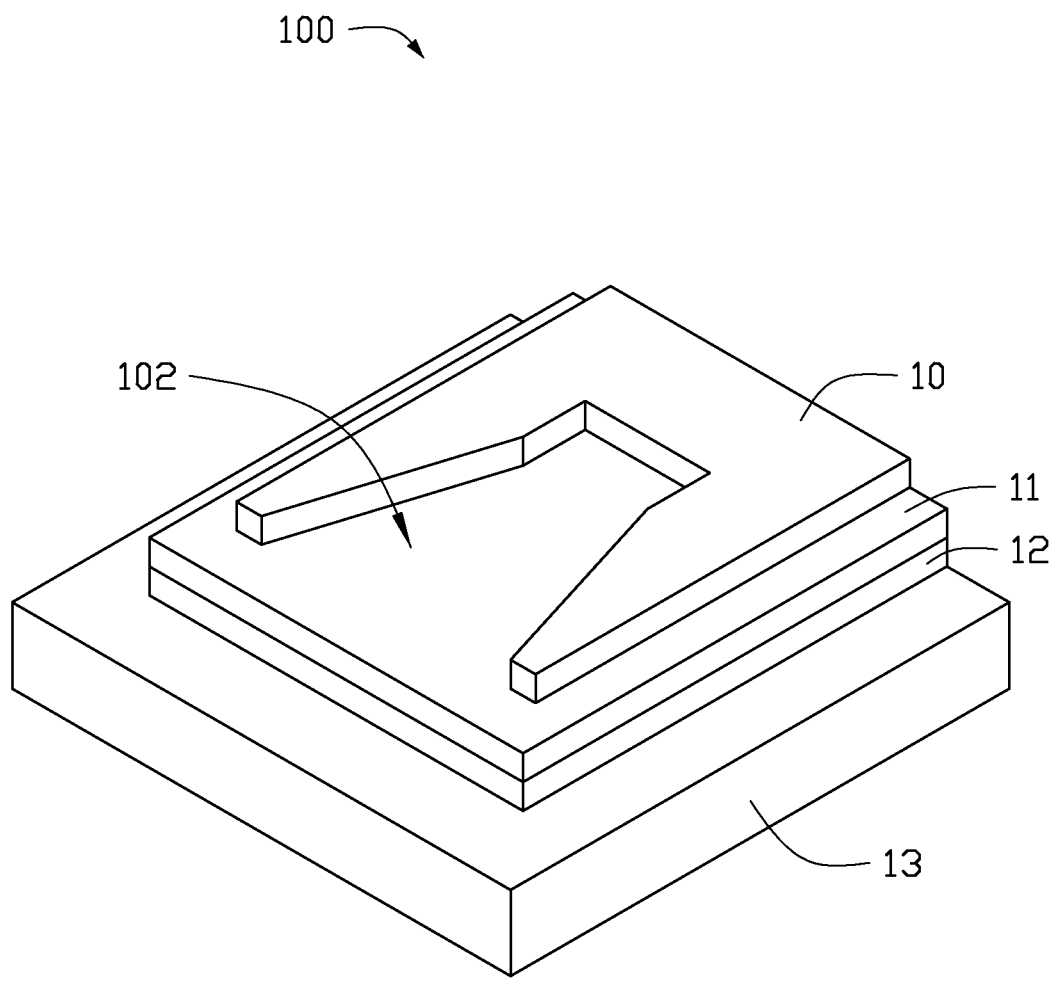

At block 205, as shown in FIG. 6, the notch 102 is defined on the first piezoelectric layer 10. In the embodiment, a cross section of the notch 102 can be trapezoid.

Figure 7:
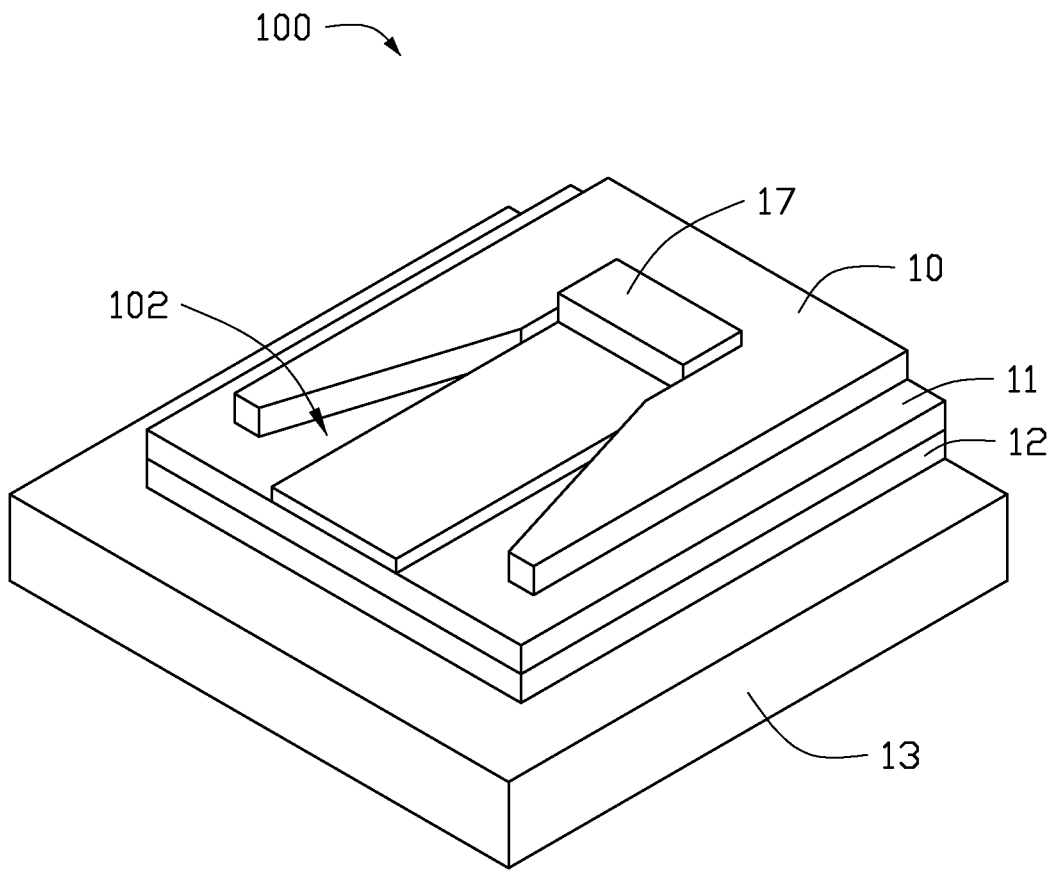
Figure 8:
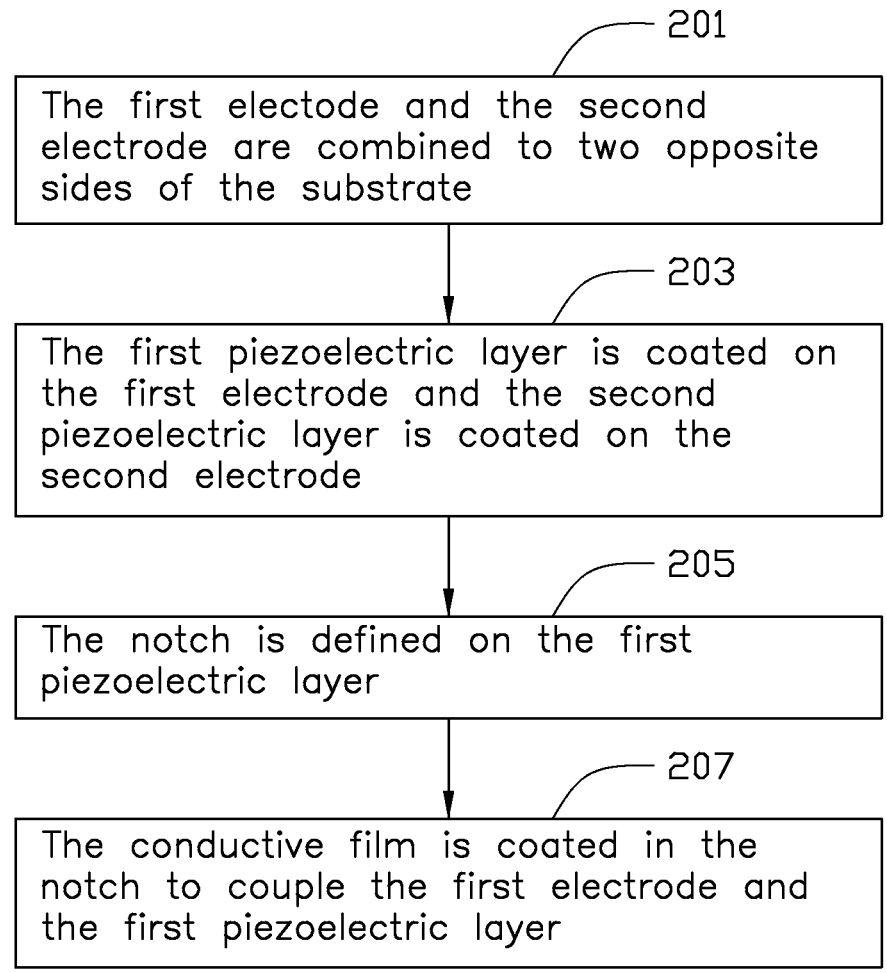
FIG. 8 is a flowchart of the manufacturing method of the ultrasonic sensor of FIG. 1.

At block 207, as shown in FIG. 7, the conductive film 17 is coated in the notch 102 to couple the first electrode 11 and the first piezoelectric layer 10. In the embodiment, the conductive film 17 is made of conductive silver paste and a diameter of silver particle in the conductive silver paste is larger than 0.01 micrometers and less than 10 micrometers. In the embodiment, a thickness of the conductive film 17 is less than 10 micrometers and a cohesion force of the conductive film 17 is larger than a surface tension force of the first piezoelectric layer 10.

It is to be understood that even though numerous characteristics and advantages of the present embodiments have been set forth in the foregoing description, with details of the structures and functions of the embodiments, the disclosure is illustrative only; and changes may be in detail, especially in the matter of arrangement of parts within the principles of the embodiments to the full extent indicated by the broad general meaning of the terms in which the appended claims are expressed.

What is claimed is:

1. An ultrasonic sensor, comprising:
   a substrate;
   a first electrode arranged on one side of the substrate;
   a first piezoelectric layer arranged on the first electrode opposite to the substrate;
   a second electrode arranged on the other side of the substrate;
   a second piezoelectric layer arranged on the second electrode opposite to the substrate;
   a notch defined in the first piezoelectric layer; and
   a conductive film coated within the notch to couple the first electrode and the first piezoelectric layer.

2. The ultrasonic sensor of claim 1, wherein the second electrode is a transmission electrode to output a first voltage to the second piezoelectric layer and the first electrode is a reception electrode to receive a second voltage generated by the first piezoelectric layer.

3. The ultrasonic sensor of claim 1, wherein the conductive film is made of conductive silver paste.

4. The ultrasonic sensor of claim 3, wherein a diameter of silver particle in the conductive silver paste is larger than 0.01 micrometers and less than 10 micrometers.

5. The ultrasonic sensor of claim 3, wherein a cohesion force of the conductive film is larger than a surface tension force of the first piezoelectric layer.

6. The ultrasonic sensor of claim 1, wherein a thickness of the conductive film is less than 10 micrometers.

7. The ultrasonic sensor of claim 1, wherein the first electrode and the second electrode are made of monolayer transparent conducting materials.

8. The ultrasonic sensor of claim 7, wherein the monolayer transparent conducting material is one of ITO (Indium Tin Oxide), ZnO (Zinc Oxide), PEDOT (Poly-ethylenedioxythiophene), CNT (Carbon Nanotube), AgNW (Argentum Nano Wire), and graphene.

9. The ultrasonic sensor of claim 1, wherein the first piezoelectric layer and the second piezoelectric layer are made of polyvinylidene fluoride.

10. A manufacturing method of an ultrasonic sensor, comprising:
    combining a first electrode and a second electrode to two opposite sides of a substrate;
    coating a first piezoelectric layer on the first electrode and a second piezoelectric layer on the second electrode;

defining a notch on the first piezoelectric layer; and
coating a conductive film within the notch to couple the first electrode and the first piezoelectric layer.

11. The manufacturing method of claim 10, wherein the second electrode is a transmission electrode to output a first voltage to the second piezoelectric layer and the first electrode is a reception electrode to receive a second voltage generated by the first piezoelectric layer.

12. The manufacturing method of claim 10, wherein the conductive film is made of conductive silver paste.

13. The manufacturing method of claim 12, wherein a diameter of silver particle in the conductive silver paste is larger than 0.01 micrometers and less than 10 micrometers.

14. The manufacturing method of claim 12, wherein a cohesion force of the conductive film is larger than a surface tension force of the first piezoelectric layer.

15. The manufacturing method of claim 10, wherein a thickness of the conductive film is less than 10 micrometers.

16. The manufacturing method of claim 10, wherein the first electrode and the second electrode are made of monolayer transparent conducting materials.

17. The manufacturing method of claim 16, wherein the monolayer transparent conducting material is one of ITO (Indium Tin Oxide), ZnO (Zinc Oxide), PEDOT (Polyethylenedioxythiophene), CNT (Carbon Nanotube), AgNW (Argentum Nano Wire), and graphene.

18. The manufacturing method of claim 10, wherein the first piezoelectric layer and the second piezoelectric layer are made of polyvinylidene fluoride.

19. An ultrasonic sensor, comprising:

a substrate;

a first electrode and a first piezoelectric layer stacked on one side of the substrate;

a second electrode and a second piezoelectric layer stacked on the other side of the substrate;

a notch defined in the first piezoelectric layer; and a conductive film coated within the notch to couple the first electrode and the first piezoelectric layer.

* * * * *